(12) United States Patent
Jung

(10) Patent No.: US 7,700,892 B2
(45) Date of Patent: Apr. 20, 2010

(54) SEQUENTIAL LATERAL SOLIDIFICATION DEVICE AND METHOD OF CRYSTALLIZING SILICON USING THE SAME

(75) Inventor: Yun Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/880,318

(22) Filed: Jun. 30, 2004

(65) Prior Publication Data

US 2005/0056623 A1    Mar. 17, 2005

(30) Foreign Application Priority Data

Sep. 17, 2003    (KR)    ........................ 10-2003-0064507

(51) Int. Cl.
B23K 26/04    (2006.01)

(52) U.S. Cl. ........................... 219/121.62; 219/121.65; 219/121.82

(58) Field of Classification Search ............ 219/121.65, 219/121.66, 121.73, 121.82, 121.83, 121.78, 219/121.79; 438/487, 795
See application file for complete search history.

(56) References Cited

U.S. PATENT DOCUMENTS

| | | | | |
|---|---|---|---|---|
| 4,668,089 A | * | 5/1987 | Oshida et al. | 356/139.07 |
| RE33,836 E | * | 3/1992 | Resor, III et al. | 355/43 |
| 5,121,449 A | * | 6/1992 | Shiba et al. | 385/14 |
| 5,136,169 A | * | 8/1992 | Smith et al. | 250/491.1 |
| 5,309,273 A | * | 5/1994 | Mori et al. | 359/202 |
| 5,337,140 A | * | 8/1994 | Hagiwara et al. | 356/237.3 |
| 5,377,251 A | * | 12/1994 | Mizusawa et al. | 378/34 |
| 5,392,115 A | * | 2/1995 | Oshida et al. | 356/485 |
| 5,401,979 A | * | 3/1995 | Kooijman et al. | 250/559.29 |
| 5,431,564 A | * | 7/1995 | Guichet | 433/56 |
| 5,659,420 A | * | 8/1997 | Wakai et al. | 359/368 |
| 5,809,050 A | * | 9/1998 | Baldwin et al. | 372/50.21 |
| 5,841,098 A | * | 11/1998 | Gedrat et al. | 219/121.63 |
| 5,869,803 A | * | 2/1999 | Noguchi et al. | 219/121.62 |
| 5,874,711 A | * | 2/1999 | Champetier et al. | 219/497 |
| 5,913,104 A | * | 6/1999 | Piper et al. | 438/14 |
| 6,071,765 A | * | 6/2000 | Noguchi et al. | 438/166 |
| 6,274,888 B1 | * | 8/2001 | Suzuki et al. | 257/72 |
| 6,281,470 B1 | * | 8/2001 | Adachi | 219/121.62 |

(Continued)

FOREIGN PATENT DOCUMENTS

JP    405309482 A    * 11/1983

(Continued)

*Primary Examiner*—Samuel M Heinrich
(74) *Attorney, Agent, or Firm*—McKenna Long & Aldridge LLP

(57) ABSTRACT

A sequential lateral solidification device and a method of crystallizing silicon using the same controls a size and arrangement overlapping areas of laser beam patterns adjacently irradiated onto a substrate to within specific regions of a pixel area and a driving area outside the pixel area. The device includes a laser generating device irradiating a laser beam, a focusing lens focusing the laser beam, a mask having a pattern of transparent regions permitting the laser beam to be transmitted a laser beam pattern, a reduction lens reducing the laser beam pattern transmitted by the mask, a substrate having a pixel area and a driving area exposed to the irradiated laser beam pattern, a moveable stage having, on which the substrate is mounted, and a position sensor sensing an position of the irradiated laser beam pattern and controlling a size and arrangement overlapping areas between adjacently irradiated laser beam patterns.

7 Claims, 12 Drawing Sheets

U.S. PATENT DOCUMENTS

| | | | | |
|---|---|---|---|---|
| 6,366,308 | B1 * | 4/2002 | Hawryluk et al. | 347/256 |
| 6,411,368 | B1 * | 6/2002 | Matsumoto et al. | 355/67 |
| 6,459,092 | B2 * | 10/2002 | Cho et al. | 250/559.37 |
| 6,486,437 | B2 * | 11/2002 | Tanabe | 219/121.86 |
| 6,492,651 | B2 * | 12/2002 | Kerekes | 250/559.2 |
| 6,563,077 | B2 * | 5/2003 | Im | 219/121.65 |
| 6,573,531 | B1 * | 6/2003 | Im et al. | 257/45 |
| 6,577,380 | B1 * | 6/2003 | Sposili et al. | 355/67 |
| 6,590,698 | B1 * | 7/2003 | Ohtsuki et al. | 359/326 |
| 6,693,258 | B2 * | 2/2004 | Sugano et al. | 219/121.8 |
| 6,710,364 | B2 * | 3/2004 | Guldi et al. | 250/559.44 |
| 6,764,886 | B2 * | 7/2004 | Yamazaki et al. | 438/164 |
| 6,797,550 | B2 * | 9/2004 | Kokubo et al. | 438/164 |
| 6,798,498 | B2 * | 9/2004 | Abe et al. | 356/30 |
| 6,807,248 | B2 * | 10/2004 | Mihara et al. | 378/10 |
| 6,841,797 | B2 * | 1/2005 | Kokubo et al. | 257/64 |
| 6,861,614 | B1 * | 3/2005 | Tanabe et al. | 219/121.66 |
| 6,870,126 | B2 * | 3/2005 | Jyumonji et al. | 219/121.65 |
| 6,908,835 | B2 * | 6/2005 | Sposili et al. | 438/487 |
| 7,102,743 | B2 * | 9/2006 | Tsuji et al. | 356/237.2 |
| 7,105,419 | B2 * | 9/2006 | Hiramatsu et al. | 438/401 |
| 7,129,124 | B2 * | 10/2006 | Hongo et al. | 438/166 |
| 7,180,198 | B2 * | 2/2007 | Kim | 257/797 |
| 7,230,964 | B2 * | 6/2007 | Das et al. | 372/55 |
| 2002/0104750 | A1 * | 8/2002 | Ito | 204/157.15 |
| 2002/0126268 | A1 * | 9/2002 | Matsumoto et al. | 355/67 |
| 2003/0012252 | A1 * | 1/2003 | Bender | 374/32 |
| 2004/0087069 | A1 * | 5/2004 | Kusumoto et al. | 438/166 |
| 2004/0222197 | A1 * | 11/2004 | Hiramatsu | 219/121.7 |
| 2005/0109743 | A1 * | 5/2005 | Tanabe et al. | 219/121.73 |
| 2006/0040512 | A1 * | 2/2006 | Im | 438/795 |
| 2006/0154456 | A1 * | 7/2006 | Taniguchi et al. | 438/487 |
| 2007/0041410 | A1 * | 2/2007 | Hongo et al. | 372/24 |

FOREIGN PATENT DOCUMENTS

| | | | |
|---|---|---|---|
| JP | 360091021 A | * | 5/1985 |
| JP | 09061775 A | * | 8/1995 |
| KR | 10-0281364 B1 | | 11/2000 |
| KR | 10-2001-0029934 A | | 4/2001 |

* cited by examiner

) Ia

) Ia

) Ia

) Ia

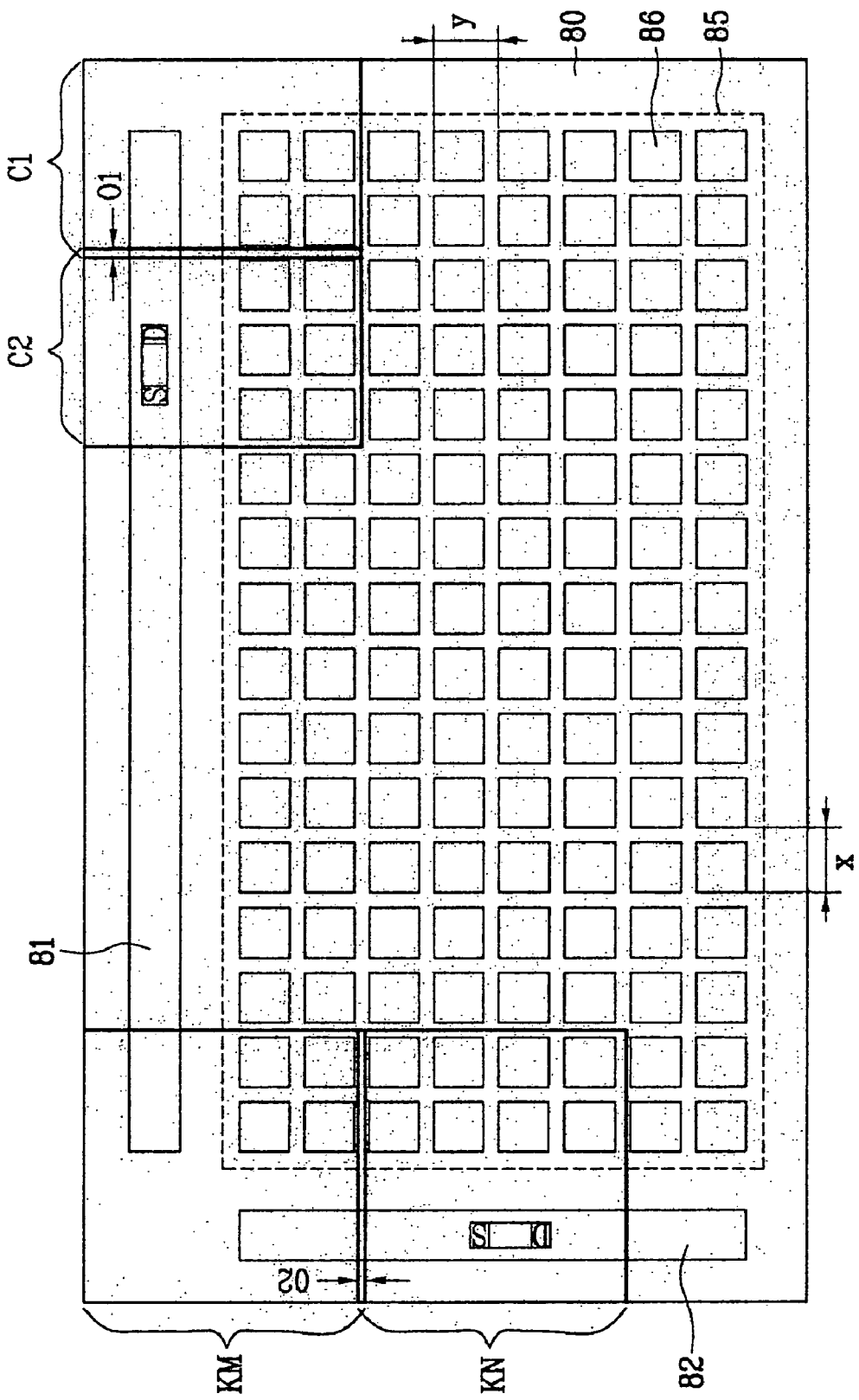

SEQUENTIAL LATERAL SOLIDIFICATION DEVICE AND METHOD OF CRYSTALLIZING SILICON USING THE SAME

This application claims the benefit of Korean Patent Application No. P2003-064507, filed on Sep. 17, 2003, which is hereby incorporated by reference for all purposes as if fully set forth herein.

BACKGROUND OF THE INVENTION

1. Field of the Invention

The present invention relates to a method of crystallizing silicon. More particularly, the present invention relates to a sequential lateral solidification device and a method of crystallizing silicon using the same. More particularly still, the present invention relates to controlling an overlapping of irradiation areas while crystallizing amorphous silicon to prevent a linear-type image deficiency caused by a defect within a thin film transistor within a circuit area or a pixel area.

2. Discussion of the Related Art

As information technologies continue to evolve, the demand for various types of displays increases. Accordingly, flat panel display (FPD) devices such as liquid crystal display devices (LCDs), plasma display panels (PDPs), electroluminescent displays (ELDs), and vacuum fluorescent displays (VFDs), have been the subject of recent research. Owing to their light weight, compact construction, low power consumption, and superior ability to display high resolution images, colors, and moving images over a wide range of viewing angles, LCD devices are widely used as substitutes for cathode ray tubes (CRTs) of televisions, and as monitors for notebook and desktop computers.

Generally, an LCD device includes an LCD panel for displaying images and a driving unit for applying driving signals to the LCD panel. The LCD panel typically includes a first substrate bonded to a second substrate and liquid crystal layer material injected between the first and second substrates.

Accordingly, the first glass substrate (i.e., a TFT array substrate) supports a plurality of gate lines regularly spaced apart from each other and extending along a first direction; a plurality of data lines regularly spaced apart from each other and extending along a second direction perpendicular to the first direction so as to cross the plurality of gate lines; a plurality of pixel electrodes formed in a matrix of pixel areas defined by crossings of the plurality of gate and data lines; and a plurality of thin film transistors (TFTs) formed in the pixel areas and connected to the plurality of gate lines for switching signals transmitted by the data lines to the pixel electrodes.

The second glass substrate (i.e., a color filter substrate) supports a black matrix layer for preventing the transmission of light outside the pixel areas; an R/G/B color filter layer for selectively transmitting predetermined wavelengths of light; and a common electrode. Alternatively, the common electrode can be formed on the first substrate to form a horizontal electric field-type LCD.

The first and second substrates described above are uniformly separated from each other by spacers and are bonded to each other via a sealant material, in which a liquid crystal injection inlet is defined. The space between the bonded first and second substrates is often referred to as a cell gap. Liquid crystal material is injected between the bonded first and second substrates by creating a vacuum within the cell gap, dipping the liquid crystal injection inlet into a vessel containing liquid crystal material, and allowing the liquid crystal material to be injected into the cell gap. After the cell gap is filled with liquid crystal material, the liquid crystal injection inlet is sealed with an air-tight sealant.

Molecules of liquid crystal material are thin and long and can be aligned to have a specific orientation. Therefore, LCD devices operate at least in part, by manipulating anisotropic optical and polarization characteristics of liquid crystal material. Specifically, the orientation of the liquid crystal molecules can be controlled in the presence of applied electric fields. Accordingly, by controlling the application of electric fields, the orientation of liquid crystal molecules is selectively manipulated to selectively refract light along the orientation direction of the liquid crystal molecules, resulting in the generation of an image.

LCDs of the type described above are known as active matrix-type LCDs and are suitable for displaying high resolution images and moving images. TFTs of such LCD devices are often formed using polycrystalline silicon as their semiconductor layer because polycrystalline silicon is a material with a high electric field mobility and low photocurrent. Polycrystalline silicon TFTs can be fabricated using a low temperature fabrication process or a high temperature fabrication process, depending upon the temperature at which the polycrystalline silicon is formed.

The high temperature fabrication process is often carried out at temperatures of about 1000° C. Exposed to such temperatures, however, most glass substrates, on which the TFTs are formed, become deleteriously modified because they have poor heat-resistance. To overcome this problem, expensive quartz substrates having excellent heat-resistance must be used. Further, the high temperature fabrication process may form an inadequately crystallized polycrystalline silicon layer having a high surface roughness and fine crystal grains. TFTs formed of high temperature polycrystalline silicon generally have poor device characteristics as compared to TFTs including polycrystalline silicon formed according to the low temperature fabrication process. Moreover, the low temperature fabrication process generally causes less damage to the underlying substrate than the high temperature fabrication process.

In forming polycrystalline silicon according to the low temperature fabrication process, a layer of amorphous silicon is vapor-deposited onto a substrate at a low temperature and subsequently crystallized to form polycrystalline silicon using either a laser annealing process or a metal induced crystallization process. According to the laser annealing process, a pulsed laser beam is irradiated about every 10 to 100 nanoseconds onto an amorphous silicon layer deposited on a substrate to repeatedly melt and re-solidify the deposited amorphous silicon layer. A related art laser annealing method will now be discussed in greater detail.

FIG. 1 illustrates a relationship between grain sizes of polycrystalline silicon and laser energy intensity irradiated onto amorphous silicon.

Referring to FIG. 1, grain sizes of polycrystalline formed by melting and re-solidifying amorphous silicon vary depending upon the intensity of laser energy irradiated onto the amorphous silicon. Intensities of the irradiated laser energy can be grouped into a first, second, and third regions.

The first region represents a range of laser energy intensities which melt only the surface of the amorphous silicon layer. After being irradiated with laser energy having an intensity within the first region, the surface of the melted silicon layer solidifies to form small grains having a substantially uniform size.

The second region represents a range of laser energy intensities which melt almost an entirety of the amorphous silicon layer. After being irradiated with laser energy having an intensity within the second region, the melted amorphous silicon layer solidifies and polycrystalline silicon is formed in what is known as a heterogeneous nucleation process, whereby unmelted particles of the amorphous silicon layer act as nucleation sites for the growth of new silicon crystals. Therefore, polycrystalline silicon formed by exposing amorphous silicon to laser energy densities in the second region is characterized as having larger grains than polycrystalline silicon formed by exposing amorphous silicon to laser energy densities in the first region. As shown in FIG. 1, however, the second region is narrower than the first region. Further, the polycrystalline silicon grain sizes associated with the second region are not as uniform as polycrystalline silicon grain sizes associated with the first region.

The third region represents a range of laser energy intensities which completely melt the amorphous silicon layer. After being irradiated with laser energy having an intensity within the third region, the melted amorphous silicon layer solidifies and polycrystalline silicon is formed in what is known as a homogeneous nucleation process to produce small grains having uniform size.

While polycrystalline silicon having large, rough silicon grains of a uniform size can be formed by controlling the number of laser beam pulses of the aforementioned second intensity region irradiated onto the amorphous silicon layer and by controlling the amount of overlap between irradiated areas, the area of grain boundaries in the polycrystalline produced is also very large. The large area of grain boundaries thus impede efficient flow of electric current, thereby decreasing the reliability of the TFT. Additionally, collisions between electrons may occur within the plurality of crystal grains to deteriorate a subsequently formed insulating layer, thereby further degrading the TFT.

To resolve problems of the above-described laser annealing method, a sequential lateral solidification (SLS) method has been provided. The SLS method leverages the natural tendency of silicon grains to grow along a direction perpendicular to a phase boundary between of a liquid phase region and a solid phase region. Accordingly, the lateral growth of silicon grains may be controlled by adjusting an energy intensity, an irradiation range, and motion of a laser beam. (Robert S. Sposilli, M. A. Crowder, and James S. Im, Mat. Res. Soc. Symp. Proc. Vol. 452, 956~057, 1997) By controlling growth of the silicon grains according to the SLS method, the area of the grain boundaries may be minimized, thereby minimizing the generation of leakage current.

In performing the related art SLS method, a substrate supporting an amorphous silicon layer is mounted onto a moveable stage. An irradiation device is then used to selectively irradiate a first narrow region of the amorphous silicon layer, thereby preventing an entirety of the amorphous silicon material from melting and crystallizing in a single irradiation. After irradiating the first narrow region, the substrate is moved and a second narrow region of the amorphous silicon layer is selectively irradiated. The process of selectively irradiating narrow regions of the amorphous silicon layer is repeated until the entire surface of the amorphous silicon layer has been irradiated. By controlling the laser energy intensity, irradiation range of the laser beam, and translation distance, the SLS method can be used to laterally grow silicon crystals to a predetermined length.

FIG. 2 illustrates a related art sequential lateral solidification (SLS) device.

Referring to FIG. 2, the related art sequential lateral solidification (SLS) device includes a laser beam generator 1 that generates laser beam pulses, a focusing lens 2 that focuses the laser beam pulses, a mask 3 that exposes portions of a substrate 10 to the laser beam pulses, and a reduction lens 4 arranged below the mask 3 that reduces the laser beam pulses transmitted through the mask 3 to a constant rate.

Generally, the laser beam generator 1 includes an XeCl or KrF laser source that produces light having a wavelength of about 308 or 248 nanometers (nm), respectively. The light produced by the laser beam generator is discharged as an untreated laser beam. The energy level of the untreated laser beam is controlled upon passing through an attenuator (not shown) and is subsequently transmitted through the focusing lens 2.

The substrate 10 supports an amorphous silicon layer and is fixed to an X-Y stage 5 below the mask 3.

The X-Y stage 5 can be shifted in incremental steps to gradually expose an entirety of the substrate 10 to the laser beam and crystallize an entirety of the amorphous silicon layer.

The mask 3 includes a transparent region 'A,' through which the laser beam may be transmitted, and an opaque region 'B,' preventing transmission of the laser beam. The width of the transparent region 'A' determines a lateral growth length of silicon crystal grains formed upon solidification of the melted portions of the amorphous silicon layer.

A related art method of crystallizing amorphous silicon using the related art SLS device of FIG. 2 will now be described in greater detail with reference to FIG. 3.

Referring to FIG. 3, a buffer layer 21 is formed on the substrate 10 and an amorphous silicon layer 22 is formed on the buffer layer 21. A chemical vapor deposition (CVD) method is generally used to form the amorphous silicon layer 22 over the buffer layer 21 and, therefore, the amorphous silicon layer 22 usually includes a high hydrogen content. Once formed, the amorphous silicon layer 22 must be dehydrogenated in a heat treatment to prevent subsequently formed polycrystalline silicon material from becoming too rough, thereby resulting in poor electrical characteristics of the TFT. After the dehydrogenation heat treatment, the mask 3 shown in FIG. 2 is arranged over the substrate 10 and portions of the amorphous silicon layer 22 exposed by the transparent regions 'A' are irradiated with laser beam pulses. The intensity of the laser beam pulses irradiated to the amorphous silicon layer 22 has a value within the third region shown in FIG. 1. Accordingly, the intensity of the irradiated laser beam pulse is sufficient to melt an entirety of the exposed portion of the amorphous silicon layer 22.

FIG. 4 illustrates crystallized areas of the amorphous silicon layer 22 shown in FIG. 3 after a first irradiation of the related art SLS method.

Referring to FIG. 4, portions of the amorphous silicon layer 22 exposed to the irradiated laser beam pulses via transparent regions 'A' of mask 3 become melted. Therefore, upon the irradiation, the exposed portions of the amorphous silicon layer 22 are placed in a liquid phase while portions of the amorphous silicon layer 22 protected by opaque regions 'B' of mask 3 (i.e., the unexposed portions of the amorphous silicon layer 22) remain in a solid phase. After the laser beam irradiation, silicon crystal grains 33 grow laterally, perpendicularly from an interface 32 of the exposed and unexposed portions of the amorphous silicon layer 22, towards a midpoint 31 of the exposed portions of the amorphous silicon layer 22. Growth of each silicon crystal grain 33 stops when one silicon crystal grain 33 contacts another silicon crystal grain 33, growing from opposite interfaces 32. It should be noted that FIG. 4 merely illustrates results of a first irradiation of the SLS method. Accordingly, the number of crystallized regions within the amorphous silicon layer 22 in a single irradiation step equals the number of transparent regions 'A' of mask 3.

As is evident, the width of the laser beam and the size of the mask 3 are fixed and, therefore, the SLS method prevents the entire amorphous silicon layer 22 from being crystallized in a single irradiation step. Moreover, as the size of the substrate 10 increases, the number of times mask 3 must be moved increases to enable repeated laser beam irradiations and crystallization of the entire amorphous silicon layer. To completely crystallize the amorphous silicon layer 22, the stage 5 must be incrementally moved a plurality of times to expose previously unexposed regions of the amorphous silicon layer 22 to laser beam pulses transmitted through the transparent regions 'A' of mask 3 in subsequent irradiation steps. Thus, regions of the amorphous silicon layer 22 that are adjacent to previously exposed regions can eventually be crystallized. Generally, the growth length of each silicon crystal grain 33 is 1.5 to 2 micrometers (μm). As will be discussed in greater detail below, the process of incrementally moving the mask 3 to form contiguous crystallized regions forms a plurality of 'crystallization blocks' within the crystallized silicon material. Accordingly, the size of each 'crystallization block' within crystallized silicon material is proportional to horizontal and vertical dimensions of the mask 3 used to incrementally expose the amorphous silicon layer 22. Specifically, however, the size of each crystallization block is associated with a reduction rate of the reduction lens 2.

Use of the mask 3 described with reference to FIGS. 2-4, is disadvantageous because the width of each transparent region 'A' is less than the width of each opaque region 'B' therebetween. Accordingly, the stage 5 must move a plurality of times in order to form a single crystallization block. Therefore, the time required to move the mask 3 or stage 5 consumes an unacceptably large portion of total time required to crystallize the entire amorphous silicon layer 22 and reduces the yield of the SLS method. To overcome the above-described problem, a related art mask 40 having transparent and opaque regions of substantially equal widths has been proposed and will now be described in detail with respect to FIG. 5.

Referring to FIG. 5, mask 40 includes transparent regions 'A' and opaque regions 'B' alternately arranged along a vertical direction. Respective widths 'a' and 'b' of the transparent and opaque regions 'A' and 'B' are adjustable but are substantially equal. In performing the SLS method described above, portions of an amorphous silicon layer not exposed by mask 40 (i.e., unexposed portions of the amorphous silicon layer) during a first irradiation are exposed during a second irradiation. Accordingly, a crystallization block may be formed in only two irradiation procedures using a 1-pulse laser beam via mask 40. Using mask 40, the crystallization block may be formed in only two irradiation procedures by moving the stage 5 along a vertical direction in an amount equal to half the added length of the width 'a' of the transparent region 'A' and the width 'b' of the opaque region 'B' (i.e., (a+b)/2).

FIGS. 6A and 6B illustrate arrangements of crystallized regions of the amorphous silicon layer after being exposed to first and second irradiations via mask 40.

Referring to FIG. 6A, upon performing a first irradiation, laser beam pulses are irradiated onto portions of an amorphous silicon layer exposed by transparent regions 'A' of mask 40. Accordingly, first irradiated regions Ia of the amorphous silicon layer are completely melted and, subsequently, crystallized. Upon crystallization, grain growth occurs laterally from the liquid phase/solid phase interface and proceeds perpendicularly from the liquid phase/solid phase interface toward a mid-point of each first irradiated region Ia.

Referring to FIG. 6B, after performing the first irradiation, the substrate is incrementally moved so that the transparent regions 'A' of mask 40 expose previously unexposed portions of the amorphous silicon layer and a second irradiation is performed. Accordingly, second irradiated regions 1b of the amorphous silicon layer are completely melted and, subsequently, crystallized. Upon crystallization, silicon grains resultant from the first irradiation act as nucleation sites for new grains to grow perpendicularly from the liquid phase/solid phase interface toward a mid-point of each second irradiated region 1b. Accordingly, the lateral growth length of the grains formed after the second irradiation is twice the lateral growth length of grains formed after the first irradiation.

FIG. 7 illustrates the application of a related art SLS method using the mask 40. FIG. 8 illustrates a plan view of a portions of the amorphous silicon layer crystallized upon performing the SLS method shown in FIG. 7.

Referring to FIG. 7, mask 40 is arranged over an predetermined area (i.e., upper-right corner) of substrate 60 having amorphous silicon deposited thereon. After a first irradiation process, portions of the substrate 60 exposed by the mask 40 are shifted along a −X-axis direction (Movement ①) by an amount equal to length 'L' of the transparent region 'A' and a second irradiation process is performed. The incremental shifting and irradiating steps are repeated along the −X-axis direction across the horizontal length of substrate 60. Subsequently, portions of the substrate 60 exposed by mask 40 are shifted along the −Y-axis direction (Movement ②) by an amount equal to half the added length of the widths 'a' and 'b' of the transparent and opaque regions 'A' and 'B' (i.e., (a+b)/2) and another irradiation process is performed to form a crystallization block. Next, portions of the substrate 60 exposed by mask 40 are shifted along the +X-axis direction (Movement ③) by an amount equal to length 'L' of the transparent region 'A' and another irradiation process is performed to form another crystallization block. The incremental shifting and irradiating steps are repeated along the +X-axis direction across the horizontal length of substrate 60 to crystallize portions of the amorphous silicon layer not previously exposed during Movement ①, thereby forming crystallization blocks (e.g., C2 and C1). Subsequently, portions of the substrate 60 exposed by mask 40 are shifted along the −Y-axis direction (Movement ④) by an amount equal to vertical length 'S' of the mask 40 and another irradiation process is performed. Accordingly, the Movements (①, ②, ③, and ④) are repeated as necessary to crystallize an entirety of the amorphous silicon layer.

Generally, the aforementioned SLS method is performed by fixing the mask 40 and moving only the substrate 60. Accordingly, portions of the substrate 60 exposed by mask 40 are incrementally shifted by moving the substrate 60 along a direction opposite the direction indicated by the arrows accompanying Movements ①, ②, ③, and ④. Specifically, while portions of the substrate 60 exposed during Movement ① are shifted in the −X-axis direction, the substrate 60 is actually moved along the +X-axis direction in an amount equal to length 'L' of the transparent region 'A'. Similarly, while portions of the substrate 60 exposed during Movement ② are shifted in the −Y-axis direction, the substrate 60 is actually moved along the +Y-axis direction in an amount equal to (a+b)/2. Further, while portions of the substrate 60 exposed during Movement ③, the substrate 60 is actually moved along the −X-axis in an amount equal to length 'L' of the transparent region 'A'. Lastly, while portions of the substrate 60 exposed during Movement ④ are shifted in the −Y-axis direction, the substrate 60 is actually moved along the +Y-axis direction in an amount equal to length 'S' of mask 40. Additionally, after each Movement the region of the amorphous silicon layer exposed by the mask 40 is irradiated and crystallized (initially irradiated areas of the substrate 60, after the substrate 60 is moved along a specific direction are shown as hatched).

Referring to FIG. 8, upon performing the SLS method as described above with respect to FIG. 7, a plurality of regions of the amorphous silicon layer supported by substrate 60 are exposed to irradiated laser beam pulses at least twice. Such regions will hereinafter be referred to as 'overlapping areas'. Specifically, a first overlapping area 01 is formed when incrementally shifting the substrate 60 along the X-axis by the amount equal to 'L'. Similarly, a plurality of second overlapping areas 02 are formed when incrementally shifting the substrate 60 along the Y-axis by the amount equal to (a+b)/2. Accordingly, overlapping areas of crystallization are formed within each crystallization block and between adjacent crystallization blocks. First and second twice-irradiated areas 51 and 52, respectively, are formed within the first and second overlapping areas 01 and 02, respectively, and quadruply-irradiated area 53 arranged at crossings of the first and second overlapping areas 01 and 02.

Due to the numerous times the silicon material within the first and second overlapping areas 01 and 02 is irradiated, ruptures undesirably occur within the crystallized silicon grains in the twice- and quadrudply-irradiated areas 51-53. Moreover, when devices are formed using silicon material occupying the overlapping areas, the electron mobility of those devices becomes undesirably deficient.

FIG. 9 illustrates a plan view of an arrangement of crystallization blocks formed in accordance with the related art SLS method and a layout of devices formed from silicon crystallized in the related art SLS method.

Referring to FIG. 9, and as described above, the related art SLS method forms a layer of polycrystalline silicon including a plurality of crystallization blocks C1, C2, ..., CM, CN, etc., wherein each crystallization block contains overlapping irradiated areas and wherein adjacent crystallization blocks overlap each other. Subsequently, the layer of polycrystalline silicon is patterned during the formation of a plurality of devices (i.e., semiconductor layer of pixels or TFTs within pixel areas 71, and components of the gate and source drivers 61 and 62, respectively). Undesirably, at least a portion of these devices are formed using polycrystalline silicon material within these overlapping areas.

As mentioned above, portions of the crystallized silicon in the overlapping areas have poorer electrical characteristics than portions of the crystallized silicon outside the overlapping areas. Accordingly, devices formed using portions of the crystallized silicon in the overlapping areas have poorer electrical characteristics as compared to devices formed using portions of the crystallized silicon outside the overlapping areas. Accordingly, a picture quality of the pixel areas 71, as well as a those formed in non-overlapping areas, and so, linear deterioration may occur in a line quality of source or gate lines within the source or gate drivers 62 or 61, may become deteriorated.

As described above, use of the related art method SLS method of crystallizing amorphous silicon is disadvantageous because devices are formed using polycrystalline silicon material that has been irradiated multiple times. Because the crystallizing characteristic in the overlapping areas is not uniform, electrical characteristics of the silicon material within the overlapping areas are deficient and cause a systemic deterioration in devices (e.g., TFTs, gate driver, source driver, etc.) formed from the multiply-irradiated silicon material.

SUMMARY OF THE INVENTION

Accordingly, the present invention is directed to a sequential lateral solidification device and a method of crystallizing silicon using the same that substantially obviates one or more of the problems due to limitations and disadvantages of the related art.

An advantage of the present invention provides a sequential lateral solidification device and a method of crystallizing silicon using the same that can control an overlapping area of a laser beam irradiation for a crystallization of silicon, thereby preventing a linear deterioration of picture quality caused by defective characteristics of a circuit or thin film transistors of a pixel.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a sequential lateral solidification device may, for example, include a laser generating device irradiating a laser beam; a focusing lens focusing the irradiated laser beam; a mask assembly including a mask having a pattern of transparent regions through which the irradiated laser beam is transmitted in a laser beam pattern; a reduction lens reducing the laser beam pattern; a moveable stage; a substrate mounted on the moveable stage, wherein the substrate has a pixel area and a driving area defined thereon, and wherein the substrate is exposed to the irradiated laser beam pattern; and a position sensor assembly determining a position of the laser beam pattern irradiated onto the substrate and controlling an overlapping area between adjacently irradiated laser beam patterns.

In one aspect of the present invention, the sequential lateral solidification device may further include an attenuator controlling a size of the laser beam irradiated from the laser beam generator in accordance with a size of a pixel to be formed on the substrate.

In another aspect of the present invention, the position sensor assembly transmits information indicating a position of the irradiated laser beam pattern on the substrate and controls an overlapping area between adjacently irradiated laser beam patterns.

In still another aspect of the present invention, the mask assembly may further include an aperture controlling pattern controlling a size of an irradiated laser beam pattern based on the information transmitted by the position sensor assembly.

In yet another aspect of the present invention, the pixel area may include a plurality of pixels separated by a plurality of gate line areas and a plurality of data line areas crossing the plurality of gate line areas, and the driving area may include a device forming area and a device non-forming area.

In still a further aspect of the present invention, an overlapping area of adjacently irradiated laser beam patterns is arranged within the gate and data line areas and within the device non-forming area.

In yet another aspect of the present invention, the moveable stage may move in increments equal to a multiple of a length (x) and a width (y) of pixels to be formed within the pixel area.

In still another aspect of the present invention, the position sensor assembly may, for example, include a plurality of position sensors arranged at three of four edges of the substrate. Accordingly, a pair of position sensors may be arranged at opposing edges of the substrate and determine the overlapping area between adjacently irradiated laser beam patterns along a first direction and another position sensor may be arranged between the opposing edges of the substrate and determine the overlapping area between adjacently irradiated laser beam patterns along a second direction.

According to principles of the present invention, a method of crystallizing silicon using a sequential lateral solidification device including a laser generating device irradiating a laser beam, a focusing lens focusing the irradiated laser beam, a mask having a pattern of transparent regions through which the irradiated laser is transmitted in a laser beam pattern, a reduction lens reducing the laser beam pattern, a moveable stage, a substrate mounted on the moveable stage, the substrate having a pixel area and a driving area and exposed to the irradiated laser beam pattern, and a position sensor assembly determining a position of the laser beam pattern irradiated onto the substrate and controlling an overlapping area between adjacently irradiated laser beam patterns may, for example, include controlling an arrangement of overlapping areas between adjacently irradiated laser beam patterns according to information transmitted by the position sensor assembly such that the overlapping areas are arranged within a gate line area and a data line area of the pixel area and within to a device non-forming area of the driving area; and irradiating laser beam patterns onto the substrate.

In one aspect of the present invention, the method may further include controlling a size of the laser beam irradiated from the laser beam generator in accordance with a size of a pixel to be formed on the substrate.

In another aspect of the present invention, the method may further include transmitting information from the position sensor assembly indicating a position of the irradiated laser beam pattern on the substrate and controlling an overlapping area between adjacently irradiated laser beam patterns.

In still another aspect of the present invention, the method may further include controlling a size of an irradiated laser beam pattern based on the transmitted information.

In yet another aspect of the present invention, the method may further include moving the moveable stage in increments equal to a multiple of a length (x) and a width (y) of pixels to be formed within the pixel area.

In one aspect of the present invention, the position sensor assembly includes a plurality of sensors arranged at three of four edges of the substrate, wherein a pair of position sensors arranged at opposing edges of the substrate determine the presence of the overlapping area between adjacently irradiated laser beam patterns along a first direction and wherein a position sensor arranged between the opposing edges of the substrate determines the presence of the overlapping area each between adjacently irradiated laser beam patterns along a second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 13 illustrates a plan view of an arrangement of crystallization blocks formed in accordance with principles of the present invention and a layout of devices formed from silicon crystallized in the present invention.

DETAILED DESCRIPTION OF THE ILLUSTRATED EMBODIMENTS

Reference will now be made in detail to embodiments of the present invention, examples of which are illustrated in the accompanying drawings.

As will be discussed in greater detail below, a sequential lateral solidification (SLS) device and method of using the same may crystallize silicon material formed on a substrate in a controlled manner such that devices eventually formed within a pixel area and within a driving area of a liquid crystal display (LCD) panel are not formed from multiply-crystallized silicon material (i.e., crystallized silicon arranged within overlapping areas of adjacently irradiated laser beam patterns). For example, overlapping areas of adjacently irradiated laser beam patterns may be selectively arranged within gate line areas and data line areas of the pixel area and within device non-forming areas of the driving area.

Figure 10:
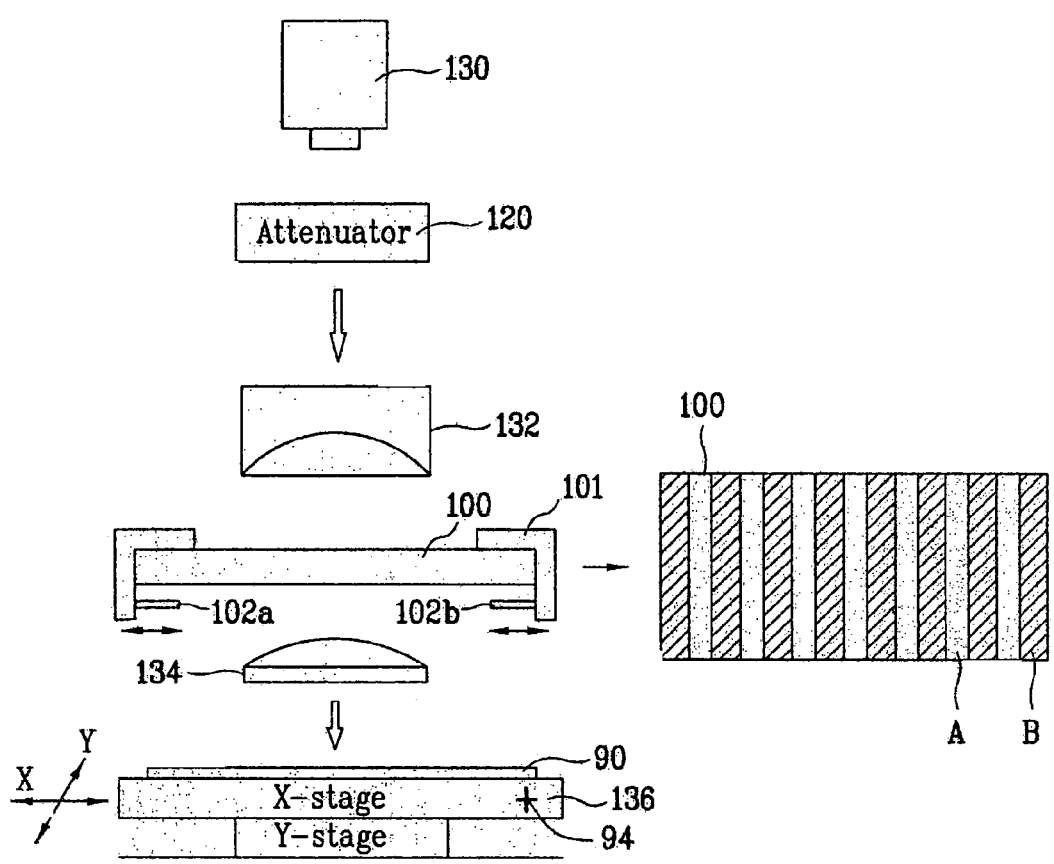
FIG. 10 illustrates an SLS device according to principles of the present invention.

FIG. 10 illustrates a sequential lateral solidification (SLS) device according to principles of the present invention.

Referring to FIG. 10, the SLS device of the present invention may, for example, include a laser beam generator 130 that generates laser beam pulses, a focusing lens 132 that focuses the laser beam pulses, a mask assembly including a mask 100 that exposes portions of a substrate 90 to a laser beam pattern, a reduction lens 134 arranged below mask 100 that reduces the laser beam pattern of laser beam pulses transmitted by the mask 100, a moveable stage 136 on which the substrate 90 is mounted, and a position sensor assembly 94 that senses an area of the substrate 90 onto which the laser beam pattern is irradiated. Accordingly the position sensor assembly 94 can be used to control size and location of overlapping areas of adjacently irradiated laser beam patterns.

In one aspect of the present invention, and as described in greater detail below, at least one pixel area and at least one driving area may be defined on the substrate 90. In another aspect of the present invention, the mask 100 may, for example, include a pattern of transparent regions 'A' and opaque regions 'B' alternately arranged along a horizontal direction. Accordingly, the laser beam pulses may be transmitted through the transparent regions 'A' of mask 100 and not through the opaque regions 'B' of mask 100 to form the laser beam pattern.

According to principles of the present invention, the position sensor assembly 94 may transmit information regarding a position of an irradiated laser beam pattern over the substrate 90. The information transmitted by the position sensor assembly 94 may be used to control a movement of the stage 136 as well as a position of a first irradiated laser beam pattern. Accordingly, the size and location of overlapping areas of adjacently irradiated laser beam patterns may be controlled by the movement of the stage 136 as well as a position of a first irradiated laser beam pattern. Thus, information transmitted by the position sensor assembly 94 may, at least indirectly, be used to control the size and location of overlapping areas of adjacently irradiated laser beam patterns.

Figure 1:
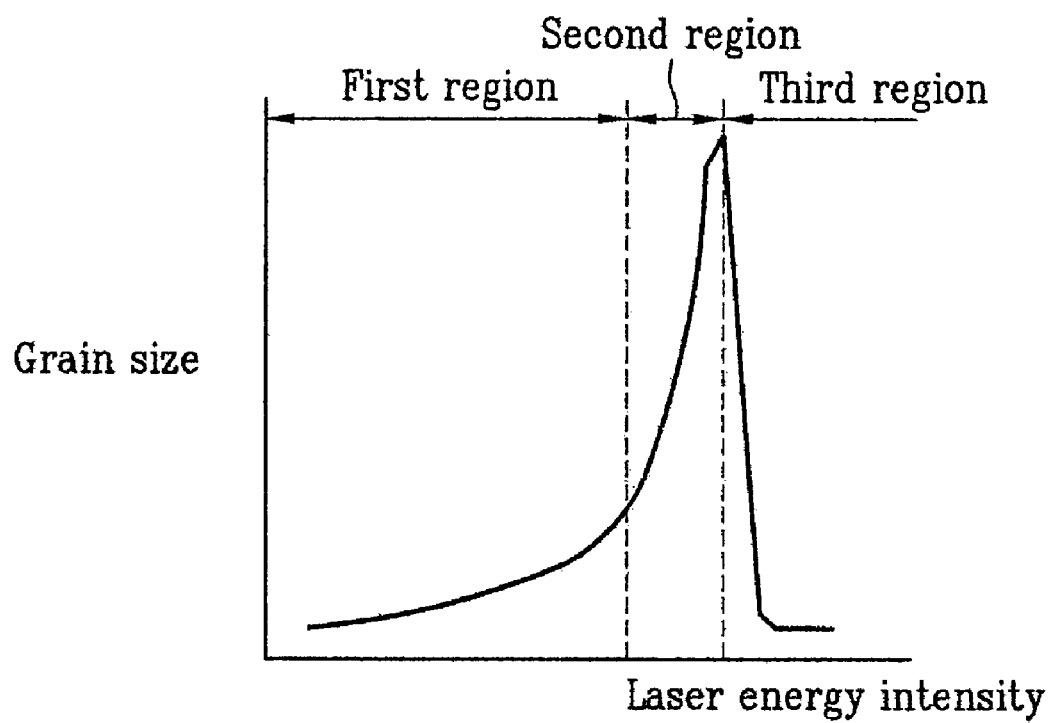
FIG. 1 illustrates a relationship between grain sizes of polycrystalline silicon and laser energy intensity irradiated onto amorphous silicon.
Figure 2:
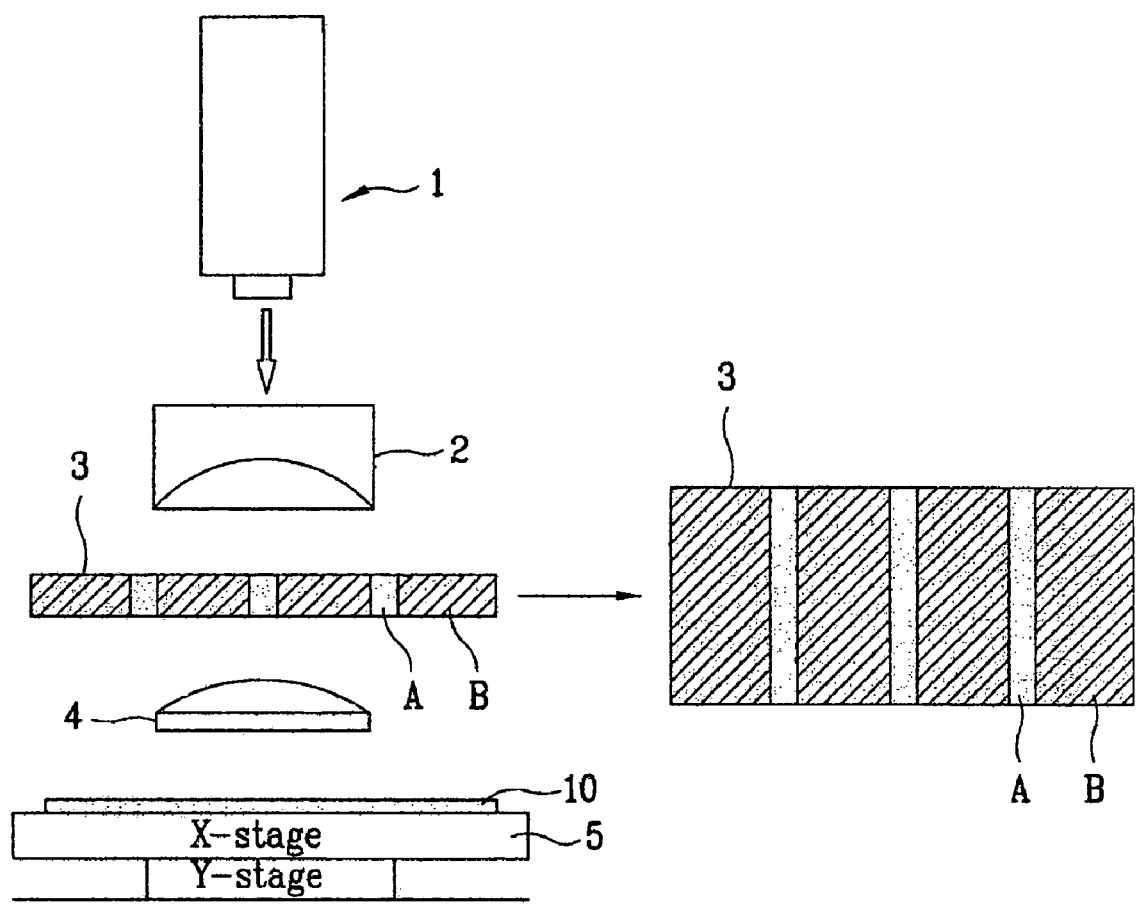
FIG. 2 illustrates a related art sequential lateral solidification (SLS) device.
Figure 3:
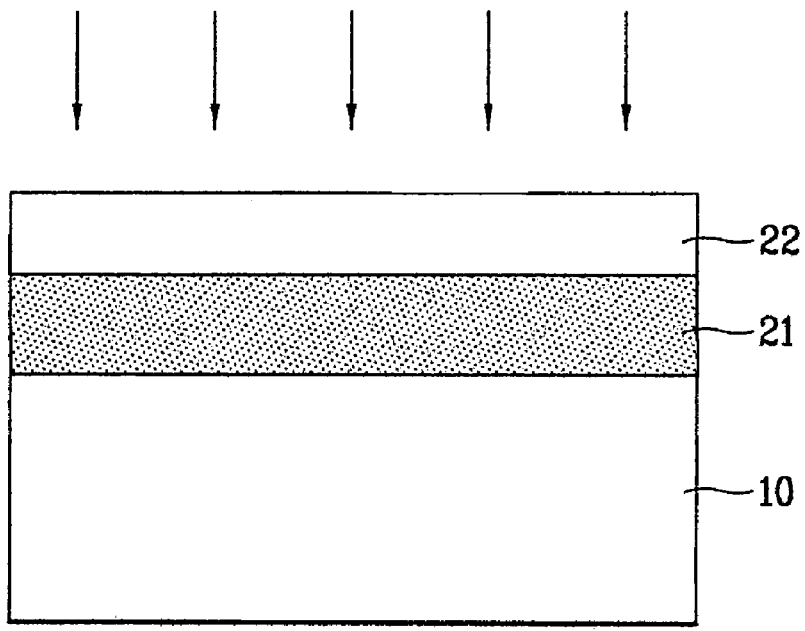
FIG. 3 illustrates a cross-sectional view of a laser annealing process in the related art SLS method.
Figure 4:
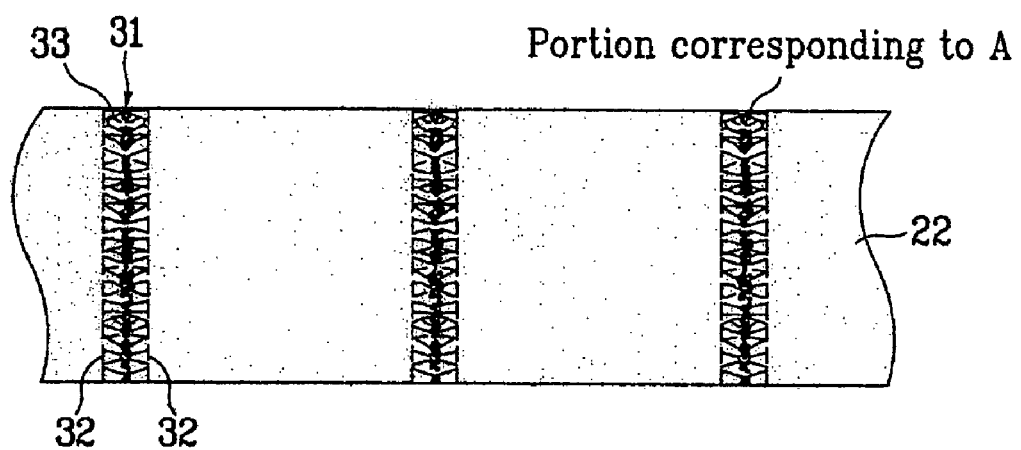
FIG. 4 illustrates crystallized areas of the amorphous silicon layer shown in FIG. 3 after a first irradiation of the related art SLS method.
Figure 5:
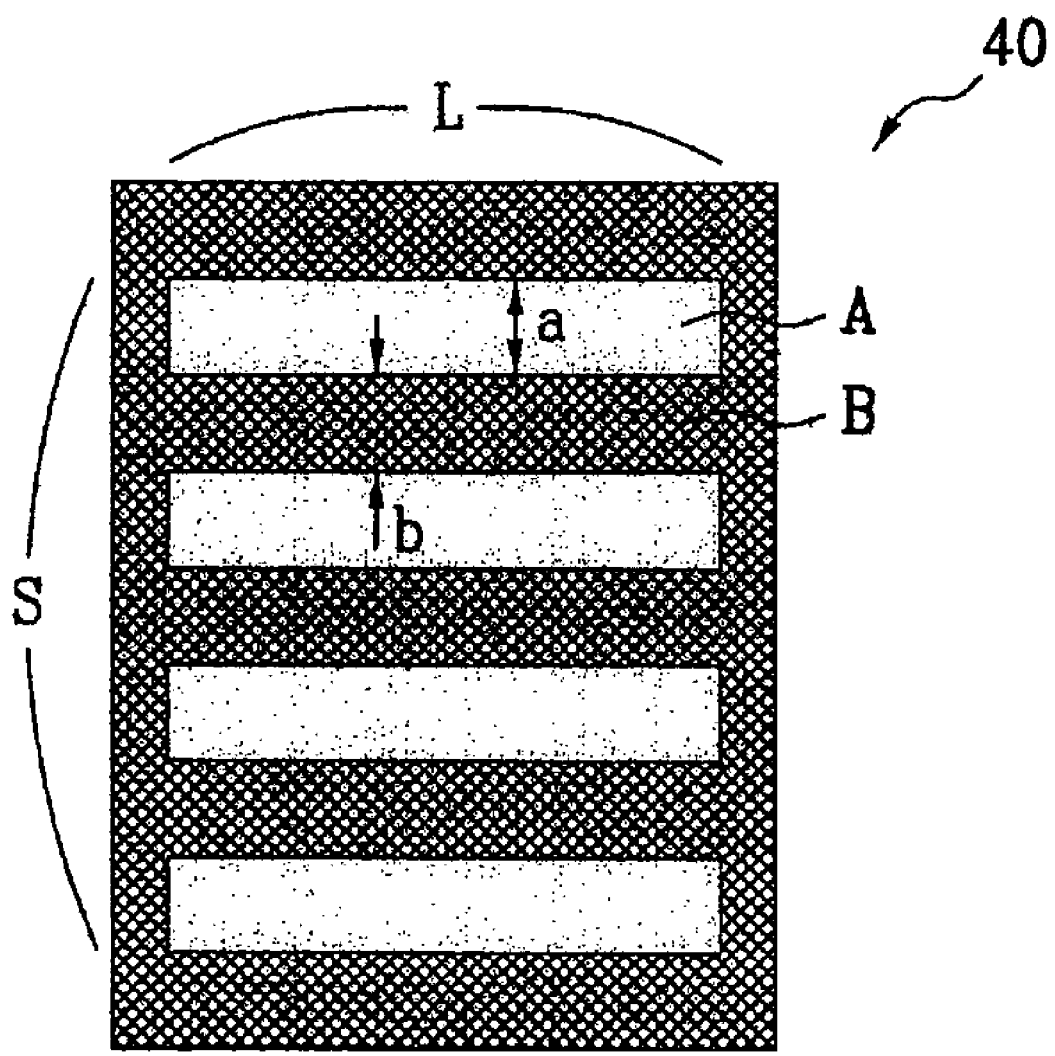
FIG. 5 illustrates a plan view of an alternative related art mask used in a related art SLS device.
Figure 6A:
FIGS. 6A and 6B illustrate arrangements of crystallized regions of the amorphous silicon layer after being exposed to first and second irradiations via the mask shown in FIG. 5.
Figure 6A:
Figure 6A:
Figure 6A:
Figure 6B:
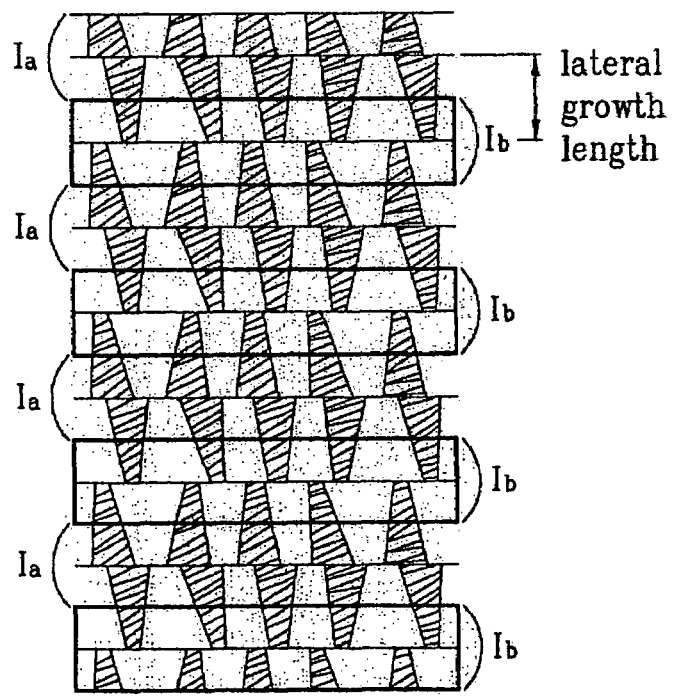
Figure 7:
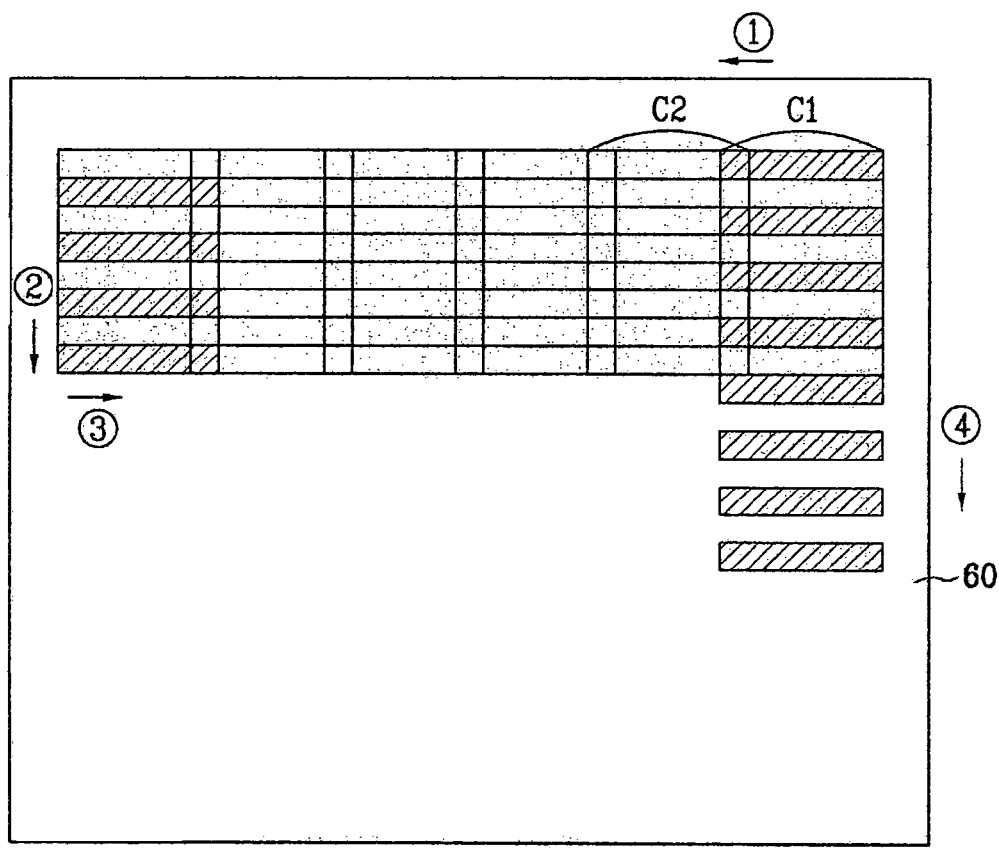
FIG. 7 illustrates the application of a related art SLS method using the mask shown in FIG. 5.
Figure 7:
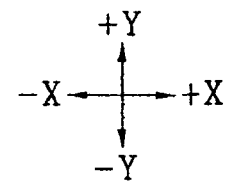
Figure 8:
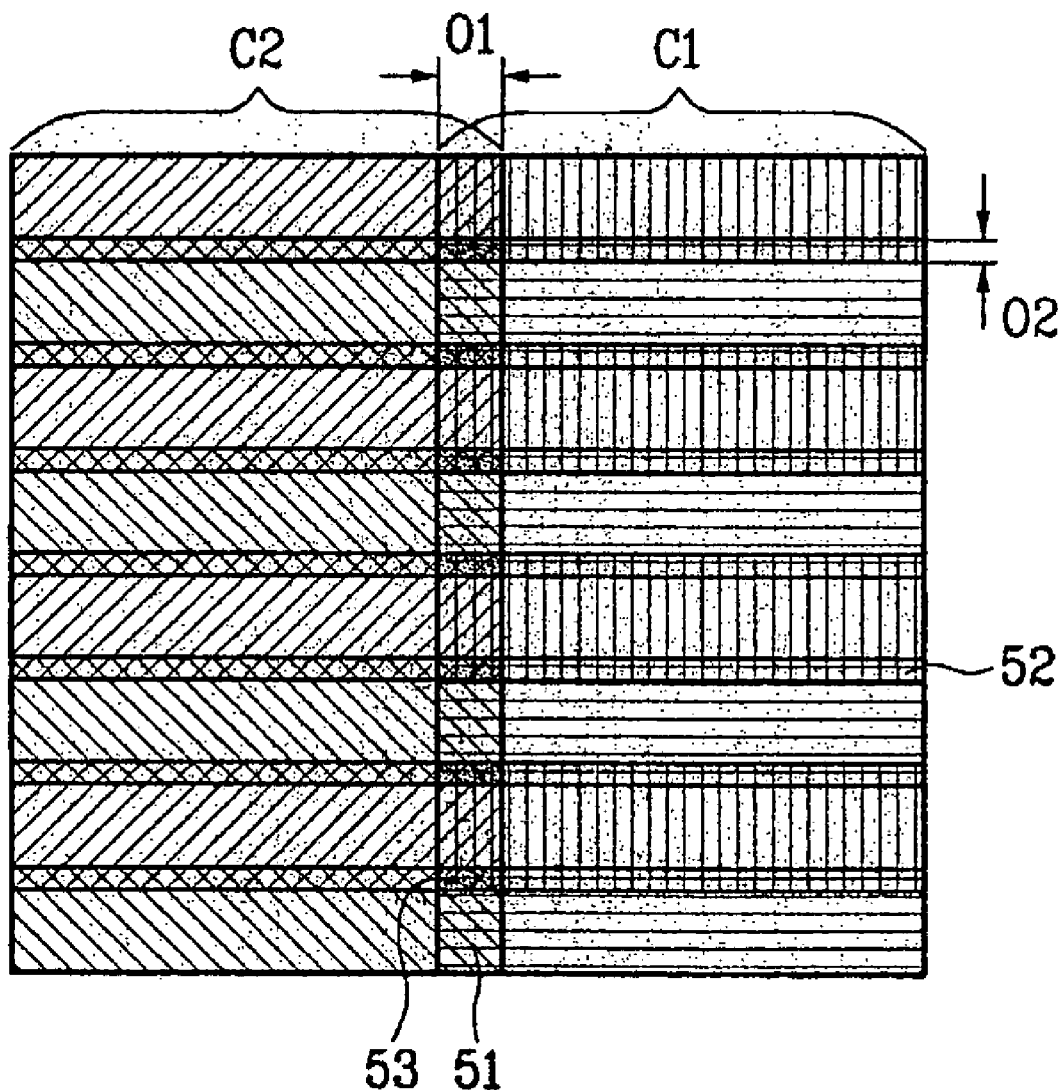
FIG. 8 illustrates a plan view of a portions of the amorphous silicon layer crystallized upon performing the SLS method shown in FIG. 7.
Figure 9:
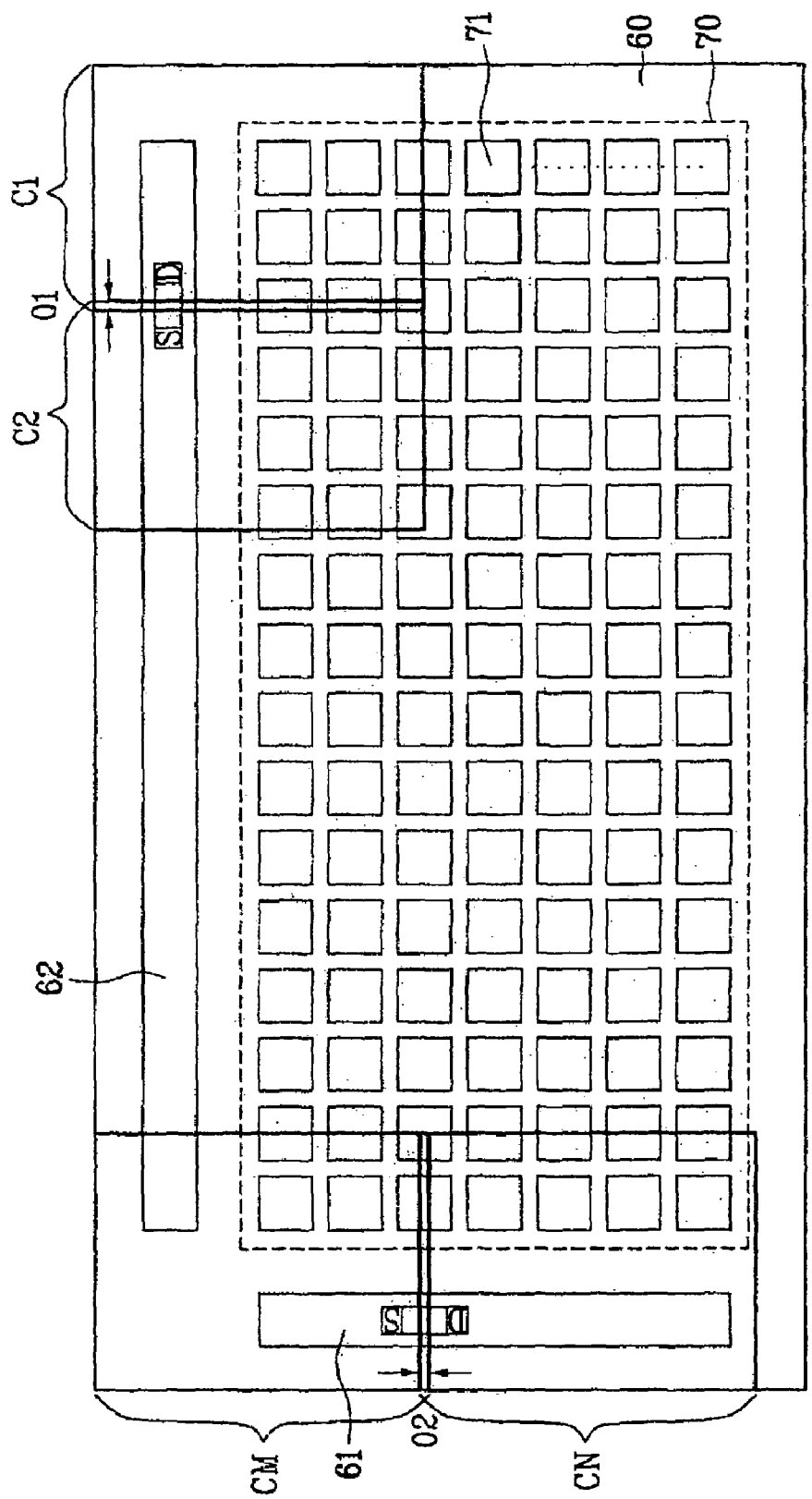
FIG. 9 illustrates a plan view of an arrangement of crystallization blocks formed in accordance with the related art SLS method and a layout of devices formed from silicon crystallized in the related art SLS method.

According to principles of the present invention, mask assembly may further include a support 101 supporting the mask 100 and aperture controlling patterns 102a and 102b that control the size of a laser beam pattern to be irradiated onto the substrate 90. In one aspect of the present invention, the aperture controlling patterns 102a and 102b may be controlled based on information transmitted by the position sensor assembly 94. In another aspect of the present invention, the aperture controlling patterns 102a and 102b may adjust a width 'w' of the transparent regions 'A'. In still another aspect of the present invention, the aperture controlling patterns 102a and 102b may be laterally shifted to control the size and position of the overlapping areas (e.g., first twice-irradiated areas 51 shown in FIG. 8) based on information transmitted by the position sensor assembly 94.

In one aspect of the present invention, an attenuator 120 may be arranged between the laser beam generator 130 and the focusing lens 132 to control the size of the irradiated laser beam in accordance with an attenuation ratio. In one aspect of the present invention, the attenuation ratio may be adjusted in accordance with the pixel size of an LCD panel to be formed from the substrate 90.

Figure 11:
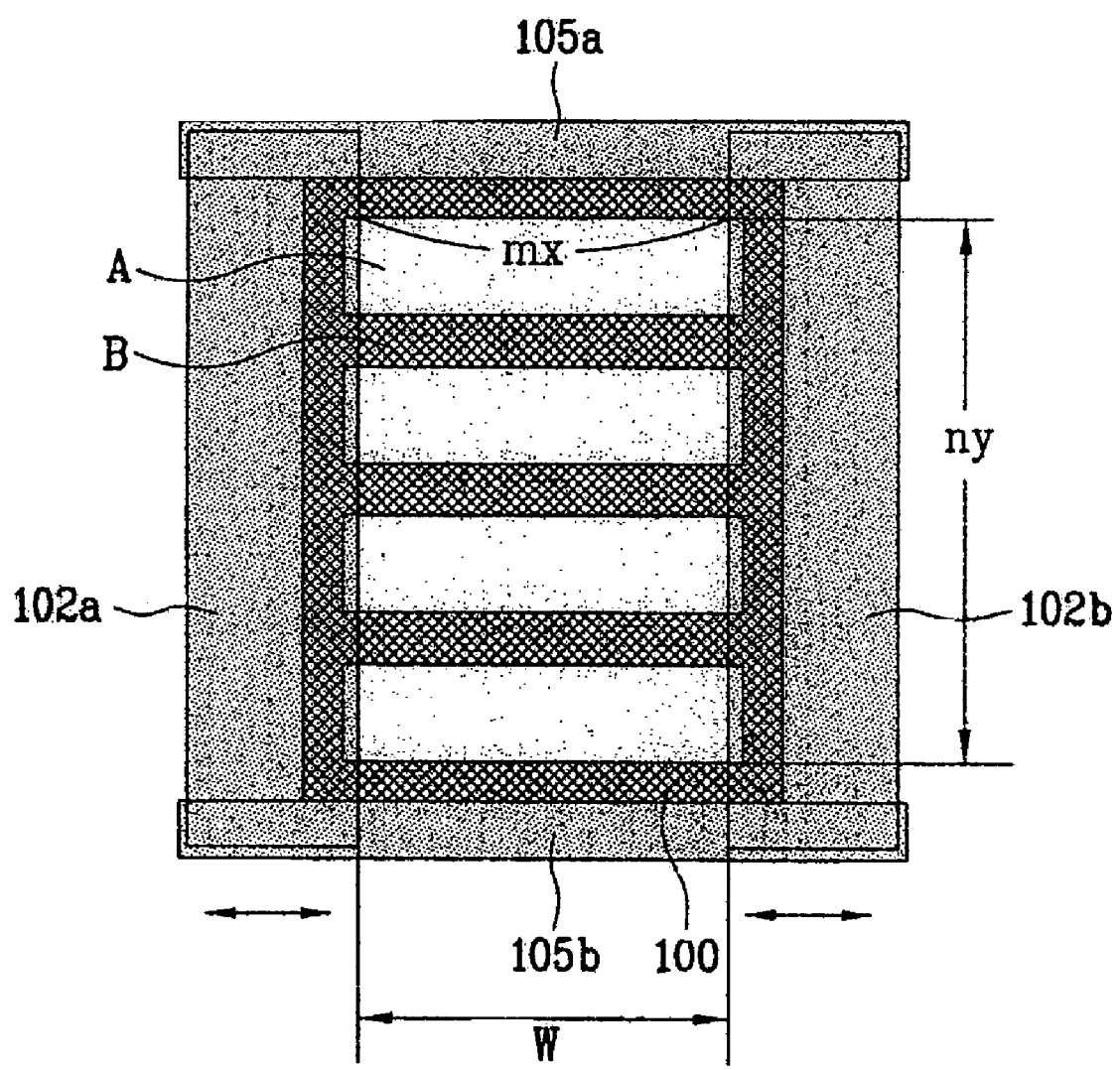
FIG. 11 illustrates a plan view of the mask assembly shown in FIG. 10.

FIG. 11 illustrates a plan view of the mask assembly shown in FIG. 10.

Referring to FIG. 11, and as described above, the mask assembly shown in FIG. 10 includes the aperture controlling patterns 102a and 102b that control the width 'w' of the transparent regions 'A.' In one aspect of the present invention, the aperture controlling patterns 102a and 102b may be controlled to adjust the width 'w' of the transparent regions to be equal to a predetermined pixel length 'x', or multiple thereof 'mx.' Further, the mask assembly may include a plurality of crystallization block controlling patterns 105a and 105b, wherein the crystallization block patterns 105a and 105b may be controlled to adjust a length of the irradiated laser beam pattern to be equal to a predetermined pixel width 'y,' or multiple thereof 'ny.' Accordingly, the crystallization block patterns 105a and 105b may be controlled to adjust total length of a crystallization block within the silicon material formed on the substrate 90. By providing the mask assembly as discussed above, predetermined portions of silicon material formed on the substrate 90 may be precisely irradiated in a controlled manner to ensure that overlapping areas of adjacently irradiated laser beam patterns are arranged in predetermined locations, as will be discussed in greater detail below.

Figure 12:
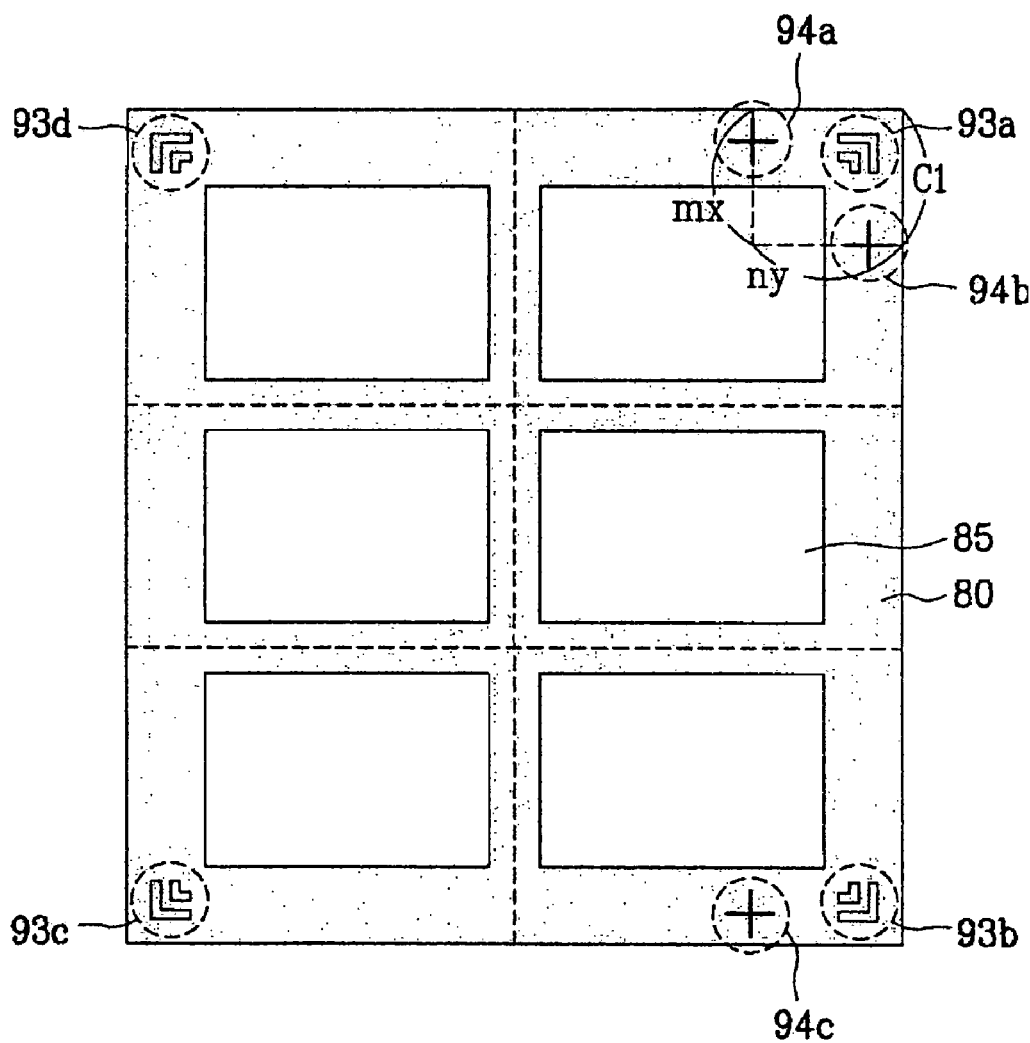
FIG. 12 illustrates a plan view of substrate arranged on the moveable stage in the SLS device shown in FIG. 10.

FIG. 12 illustrates a plan view of substrate arranged on the moveable stage 136 of the SLS device shown in FIG. 10.

Referring to FIG. 12, the substrate 90 may, for example, comprise a glass base substrate and a layer of silicon (e.g., amorphous silicon) may be formed over the entire surface of the glass base substrate. The substrate 90 may be used to form components of a plurality of LCD panels. Accordingly, a plurality of TFT array substrates 80 may be simultaneously formed by crystallizing the silicon layer and, subsequently, patterning the crystallized silicon layer to form a plurality of devices. In one aspect of the present invention, each TFT array substrate 80 may, for example, include a pixel area for displaying images and a driving area for driving the pixel area. The pixel area may, for example, include a plurality of gate lines, a plurality of data lines crossing the plurality of gate lines, a plurality of devices such as TFTs formed at crossings of the gate and data lines, and a plurality of pixel electrodes connected to the plurality of TFTs. The driving area may, for example, include a plurality of devices such as gate and source drivers for applying driving signals to the plurality of gate and data lines. In one aspect of the present invention, the substrate 90 may further include alignment keys 93a, 93b, 93c, and 93d formed at corner regions thereof to facilitate aligning the substrate 90 with another substrate (not shown) during a subsequent LCD panel fabrication step.

According to principles of the present invention, the position sensor assembly 94 may, for example, include first, second, and third position sensors 94a, 94b, and 94c, respectively. In one aspect of the present invention, the first to third position sensors 94a-c may be positioned on the SLS device, transmit information related to their position relative to the substrate 90, and sense the presence of overlapping areas between adjacently irradiated laser beam patterns. In another aspect of the present invention, the position sensors 94a, 94b, and 94c may be arranged on the movable stage 136 such that the position sensors 94a, 94b, and 94c are arranged at three of four edges of substrate 90, which is fixedly mounted to the moveable stage 136.

Based on information related to locations on the substrate 90 at which gate and data lines are to be formed, the position sensors 94a-c transmit information related to the position of laser beam patterns irradiated onto the substrate 90. For example, the first and third position sensors 94a and 94c, respectively, may be arranged at opposing first and third edges of substrate 90 and be moved along the X-axis direction in correspondence with an incremental shifting of the laser beam pattern along the X-axis direction to determine an edge of the irradiated laser beam pattern present along the Y-axis direction. Subsequently, the second position sensor 94b may be arranged at a second edge of the substrate 90 and be moved along the Y-axis direction in correspondence with an incremental shifting of the laser beam pattern along the Y-axis direction to determine an edge of the irradiated laser beam pattern along the X-axis direction. Accordingly, the first, second, and third position sensors 94a, 94b, and 94c may be arranged at edge portions of a currently irradiated laser beam pattern, which becomes the overlapping area in a subsequent, adjacently irradiated laser beam pattern. Accordingly, the size and arrangement of the overlapping areas generated by adjacently irradiated laser beam patterns may be controlled to correspond to regions of the pixel areas where the gate and data lines are to be formed (i.e., gate line areas and data line areas) as well as regions in the driving area where devices are not to be formed (i.e., device non-forming areas).

Depending upon the laser beam irradiation, the moveable stage 136 may incrementally shift the substrate 90 in steps equal to a predetermined pixel length 'x' and predetermined pixel width 'y,' or multiples thereof (i.e., mx and ny, respectively, wherein m and n are integers).

An arrangement of overlapping areas of adjacently irradiated laser beam patterns will now be described in greater detail with respect to FIG. 13.

Referring to FIG. 13, each TFT array substrate 80 may, for example, include a pixel area 85 and a driving area arranged outside the pixel area 85.

Within the pixel area 85, a plurality of gate lines and a plurality of data lines perpendicularly crossing the plurality of gate lines may eventually be formed to define a plurality of pixels 86. Additionally, a plurality of devices such as TFTs may eventually be formed within the pixels 86, adjacent to crossings of the gate and data lines, and a plurality of pixel electrodes may eventually be connected to the plurality of TFTs.

Within the driving area, a plurality of devices such as a gate driver 82, for applying driving signals to the gate lines, and a source driver 81, for applying driving signals to the data lines, may eventually be formed. Although not explicitly shown, the gate and source drivers 82 and 81, respectively, may each be divided into a plurality of individual driver integrated circuits (ICs) which individually apply driving signals to predetermined groups of the plurality of gate lines and data lines. In one aspect of the present invention, each driver IC within the gate and source drivers 82 and 81 may be spaced apart from each other by a predetermined distance.

Therefore, and in accordance with principles of the present invention, overlapping areas of adjacently irradiated laser beam patterns within the pixel area may be arranged within gate line areas and data line areas. Further, overlapping areas of adjacently irradiated laser beam patterns within the driving area may be arranged between driver ICs (i.e., device non-forming areas).

A method of crystallizing silicon using the SLS device and method according to principles of the present invention will now be described in greater detail.

First, a substrate 90 is provided and an amorphous silicon layer may be deposited over an entire surface of the substrate 90. The substrate 90 may then be mounted onto the moveable stage 136 of the SLS device shown in FIG. 10. Subsequently, the mask 100 may be arranged over the substrate 90 and the process of irradiating laser beam patterns and incrementally shifting the substrate 90 may be performed. In one aspect of the present invention, the moveable stage 136 may be incrementally shifted such that predetermined portions of the substrate 90 are sequentially irradiated with laser beam patterns, thereby forming a plurality of crystallization blocks C1, C2, . . . KM, KN, etc.

Between irradiation of the laser beam patterns, the first and third position sensors 94a and 94c, respectively, may be positioned in such a manner as to be arranged within the first overlapping area 01 formed between a previously irradiated laser beam pattern and a subsequently irradiated laser beam pattern and determine a position of the first overlapping area 01 along the Y-axis. Further, the second position sensor 94b may be positioned in such a manner as to be arranged within the second overlapping area 02 formed between the previously irradiated laser beam pattern and a subsequently irradiated laser beam pattern and determine a position of the second overlapping area 02 along the X-axis. As described above, the first and second overlapping areas 01 and 02 constitute edge portions of crystallization blocks formed from adjacently irradiated laser beam patterns.

As described above, the first to third position sensors 94a-c transmit information related to the position of the position sensors 94a, 94b, and 94c, arranged sensed edge portions of irradiated laser beam patterns. The aperture controlling patterns 102a and 102b may be selectively manipulated based on information transmitted by the position sensors to control the size and location of the overlapping areas between adjacently irradiated laser beam patterns (i.e., previously and subsequently irradiated laser beam patterns) to within gate and data line areas and within device non-forming areas.

According to principles of the present invention, a size of the pixel 86 formed on the TFT array substrate 80 can vary depending, for example, upon the size of the LCD panel to be fabricated from the TFT array substrate 80. Therefore, the attenuation ratio set by the attenuator 120 may be controlled, thereby adjusting the size and location of overlapping area between adjacently irradiated laser beam patterns without having to replace or further modify mask 100.

According to the principles of the present invention, crystallization blocks C1, C2, . . . KM, KN, etc., may be formed such that first and second overlapping areas 01 and 02 are precisely arranged within gate and data line areas of the pixel area 85. Further, the laser beam pattern is dimensioned, and the moveable stage 136 is shifted, in accordance with the dimensions of the pixels, thereby facilitating the positioning of the edge of each laser beam pattern to within the gate line and data line areas. Therefore, devices patterned from the crystallized silicon layer do not include portions of the crystallized silicon layer within the first and second overlapping areas 01 and 02. As a result, devices formed over the entire surface of the substrate 90 may be formed with a substantially uniform electron mobility and electrical characteristic. By limiting formation of the overlapping areas in the pixel area to within the gate and data line areas (i.e., regions of pixel area 85 excluding regions occupied by pixels 86), channel regions of TFTs within the pixels may be formed by removing (e.g., patterning) portions of crystallized silicon within the overlapping areas.

According to further principles of the present invention, crystallization blocks C1, C2, . . . KM, KN, etc., may be formed such that first and second overlapping areas 01 and 02 are precisely arranged within the device non-forming areas of the gate and source driver areas 82 and 81, respectively. In one aspect of the present invention, once the overlapping areas of adjacently irradiated laser beam patterns are determined to correspond to the gate and data line areas of the pixel area 85, no devices are formed within portions of the gate and source drivers 81 and 82 which are collinear with extensions of the gate line and data line areas.

In one aspect of the present invention, the devices formed within the gate and source drivers 81 and 82 may include the same material and layers as the devices formed within the pixel area 85.

As described above, polycrystalline silicon TFTs of an LCD device may be formed by depositing a layer of amorphous silicon over an entire surface of a substrate 90. The amorphous silicon layer may then be crystallized according to the SLS method outlined above to form a polycrystalline silicon layer. After the crystallizing process of the present invention, the devices of the pixel area 85, the gate driver area 81, and the source driver area 82 may be formed. For example, predetermined portions of the polycrystalline silicon layer may then be patterned to form semiconductor layers of various devices. Subsequently, a metallic material may be deposited and patterned to form a plurality of gate lines and data lines in the gate and data line areas and a device having the semiconductor layer, a gate electrode, and source and drain electrodes may thus be formed.

As described above, the substrate 90 may include a plurality of TFT array substrates, each of which is to be provided with devices having predetermined arrangements and dimensions. Therefore, an arrangement of overlapping areas of adjacently irradiated laser beam patterns may be aligned to regions in the pixel area 85 in which gate and data lines are to be eventually formed. Further, an arrangement of overlapping areas of adjacently irradiated laser beam patterns may be aligned to regions of the driving areas in which no devices (e.g., driving ICs) are to be formed. Accordingly, position sensors that determine positions of the irradiated laser beam patterns are required in the SLS device of the present invention.

As also described above, the dimensions of the laser beam pattern, irradiated by a 1-pulse laser beam, are adjusted to correspond to the actual dimensions of pixels to be formed on the substrate (or multiples thereof). Accordingly, the crystallization blocks of the present invention have dimensions which correspond to dimensions of pixels (or multiples thereof). Moreover, the widths overlapping areas of adjacently irradiated laser beam patterns may be selectively adjusted to be smaller than the width of the data or gate lines.

As also described above, devices may be prevented from being formed within portions of the gate and source driver areas which are collinear with extensions of the gate line and data line areas.

Applied generally to flat panel displays, the principles of the present invention permit overlapping areas of adjacently irradiated laser beam patterns to selectively consume portions of a crystallized silicon layer that will not be used in the subsequent formation of devices such as TFTs. When pixel sizes of the display device increase, the area being crystallized by a 1-pulse laser beam irradiation should be controlled using a mask that is proportional to a multiple of the length (x) and width (y) of pixel of the display device.

Use of the SLS device and crystallization method of the present invention are beneficial because an overlapping area of adjacently irradiated laser beam patterns may be confined to an area of a display device to be occupied by gate lines or data lines, or where no device will ultimately be formed. Accordingly, non-uniformity in device characteristics such as electron mobility may be eliminated and an ability to display images may be enhanced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A sequential lateral solidification device, comprising:
   a laser generating device irradiating a laser beam;
   a focusing lens focusing the irradiated laser beam;
   a mask having a plurality of line patterns of transparent region through which the irradiated laser beam is transmitted in a laser beam pattern;
   a reduction lens reducing the laser beam pattern;
   a moveable stage;
   an aperture controlling pattern between the mask and the moveable stage;
   a substrate having a silicon layer mounted on the moveable stage, the substrate having a pixel area and a driving area defined thereon and exposed to the irradiated laser beam pattern, wherein the pixel area includes a plurality of pixels separated by a plurality of gate line areas and a plurality of data line areas crossing each other, and the driving area includes a device forming area and a device non-forming area;
   a plurality of position sensors arranged at edges of the substrate and configured to be moved to edge portions of the laser beam pattern irradiated onto the silicon layer, wherein the plurality of position sensors transmit information indicating the position of each position sensor to control an overlapping area between adjacently irradiated laser beam patterns;
   an attenuator controlling a size of the laser beam irradiated from the laser beam generator in accordance with a size of the pixel to be formed on the substrate;
   wherein the moveable stage and the aperture controlling pattern are controlled based on the information from the plurality of position sensors over the position of the laser beam pattern irradiated on the substrate and positions of the gate and data line areas of the pixel area and the non-forming area of the driving area on the substrate and wherein the moveable stage moves in increments equal to a multiple of a length (x) and a width (y) of pixels to be formed within the pixel area so that an overlapping area between adjacently irradiated laser beam patterns is located within the gate and data line areas of the pixel area and within the device non-forming area of the driving area.

2. The device according to claim 1, further including an aperture controlling pattern controlling a size of an irradiated laser beam pattern based on the information transmitted by the plurality of position sensors.

3. The device according to claim 1, wherein the plurality of position sensors are arranged at three of four edges of the substrate.

4. The device according to claim 3, further including:
   a pair of position sensors arranged at opposing edges of the substrate and determining the presence of the overlapping area between adjacently irradiated laser beam patterns along a first direction; and
   a position sensor arranged between the opposing edges of the substrate and determining the presence of the overlapping area between adjacently irradiated laser beam patterns along a second direction.

5. A sequential lateral solidification device, comprising:
   a laser generating device irradiating a laser beam;
   a focusing lens focusing the irradiated laser beam;
   a mask having a plurality of line patterns of transparent region through which the focused laser beam is transmitted in a laser beam pattern;
   a reduction lens reducing the laser beam pattern;
   a moveable stage for mounting thereon a substrate having a silicon layer on which the reduced laser beam pattern is irradiated; and
   a plurality of position sensors arranged at edges of the substrate and configured to be moved to edge portions of the laser beam pattern irradiated onto the silicon layer, wherein the plurality of position sensors transmit information indicating the position of each position sensor to control an overlapping area between adjacently irradiated laser beam patterns.

6. The device according to claim 5, wherein the plurality of position sensors include a first position sensor arranged at a first edge of the substrate and configured to moved along an X-axis direction to a first edge portion of the laser beam pattern.

7. The device according to claim 6, wherein the plurality of position sensors include a second position sensor arranged at a second edge of the substrate and configured to moved along an Y-axis direction to a second edge portion of the laser beam pattern.

* * * * *